(12) United States Patent
Chiang et al.

(10) Patent No.: US 11,256,283 B2
(45) Date of Patent: Feb. 22, 2022

(54) HYBRID ASYNCHRONOUS GRAY COUNTER WITH NON-GRAY ZONE DETECTOR FOR HIGH PERFORMANCE PHASE-LOCKED LOOPS

(71) Applicant: Apple Inc., Cupertino, CA (US)

(72) Inventors: Meei-Ling Chiang, Cupertino, CA (US); Dabin Zhang, Santa Clara, CA (US); Dennis M. Fischette, Jr., Mountain View, CA (US); Shaobo Liu, Sunnyvale, CA (US); Yu Chen, Santa Clara, CA (US); Samed Maltabas, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 213 days.

(21) Appl. No.: 16/736,776

(22) Filed: Jan. 7, 2020

(65) Prior Publication Data

US 2021/0208621 A1 Jul. 8, 2021

(51) Int. Cl.
*H03K 23/00* (2006.01)
*G06F 1/04* (2006.01)
*H03K 7/06* (2006.01)
*H03K 23/58* (2006.01)

(52) U.S. Cl.
CPC .............. *G06F 1/04* (2013.01); *H03K 7/06* (2013.01); *H03K 23/005* (2013.01); *H03K 23/58* (2013.01)

(58) Field of Classification Search
None
See application file for complete search history.

(56) References Cited

U.S. PATENT DOCUMENTS

| | | | |
|---|---|---|---|
| 9,621,169 B2 | 4/2017 | Liu | |
| 9,954,536 B2 | 4/2018 | Liu | |
| 10,419,003 B1 | 9/2019 | Kim | |
| 10,505,551 B2 | 12/2019 | Liu | |
| 10,879,907 B2 | 12/2020 | Liu | |
| 2016/0187401 A1* | 6/2016 | Altus | G01R 23/10 702/78 |
| 2020/0153440 A1* | 5/2020 | Sakurai | H04N 5/378 |

OTHER PUBLICATIONS

Cohn et al., "A Gray Code Counter", IEEE Transactions on Computers, Jul. 1969, pp. 662-664, vol. C-18, Issue: 7, IEEE Computer Society.

* cited by examiner

*Primary Examiner* — Tuan T Lam
(74) *Attorney, Agent, or Firm* — Kowert Hood Munyon Rankin and Goetzel PC; Rory D. Rankin

(57) ABSTRACT

Systems, apparatuses, and methods for implementing a hybrid asynchronous gray counter with a non-gray zone detector are described. A circuit includes an asynchronous gray counter coupled to control logic. The control logic programs the asynchronous gray counter to operate in different modes to perform various functions associated with a high-performance phase-locked loop (PLL). In a first mode, the asynchronous gray counter serves as a frequency detector to count oscillator cycles within a reference clock cycle. In a second mode, the asynchronous gray counter serves as a coarse phase detector to detect a phase error between a feedback clock and a reference clock. In a third mode, the asynchronous gray counter serves as a multi-modulus divider to divide an oscillator clock down to create a feedback clock. Using a single asynchronous gray counter for three separate functions reduces power consumption and area utilization.

20 Claims, 15 Drawing Sheets

HYBRID ASYNCHRONOUS GRAY COUNTER WITH NON-GRAY ZONE DETECTOR FOR HIGH PERFORMANCE PHASE-LOCKED LOOPS

BACKGROUND

Technical Field

Embodiments described herein relate to the field of computing systems and, more particularly, to implementing a power and area efficient hybrid asynchronous gray counter with a non-gray zone detector for use with a high performance phase-locked loop (PLL).

Description of the Related Art

Phase-locked loops (PLLs) are widely used in electronic systems and integrated circuits (ICs) to generate clock signals and other types of periodic signals. PLLs can be implemented as analog or digital circuits. An analog PLL includes a phase detector, an analog low pass filter, a voltage controlled oscillator (VCO), and a frequency divider. The frequency divider is coupled in a feedback path between an output of the VCO and an input of the phase detector. The phase detector receives a feedback signal from the frequency divider, and a reference clock signal from an external source. The phase detector detects a phase difference between the reference clock signal and the feedback signal, producing a voltage that is provided to the low pass filter. The low pass filter ensures the voltage remains stable, preventing the PLL from "hunting" and thus failing to achieve a lock. The VCO generates the output clock signal having a frequency that is a function of the voltage received from the low pass filter.

A digital PLL is similarly arranged, but replaces the phase detector with a time-to-digital converter (TDC). The TDC is configured to generate a digital value based on delays at various points between the reference clock signal and the feedback signal. The digital value may be provided to a thermometer-to-binary encoder, which can provide a digital code that is a digital equivalent of the phase error (i.e. phase detector output) in the analog PLL. A digital PLL may also include a digital low pass filter, and may in some embodiments utilize a numerically controlled oscillator (NCO) in place of a VCO.

PLLs tend to consume significant power and take up considerable silicon area in an IC. For low-power applications, techniques for reducing power consumption of PLLs are desired. For space-constrained ICs, ways of reducing the area occupied by PLL circuits would be advantageous.

SUMMARY

Systems, apparatuses, and methods for implementing a hybrid asynchronous gray counter with a non-gray zone detector are contemplated. In various embodiments, a circuit includes an asynchronous gray counter and a non-gray zone detector coupled to control logic. The control logic programs the asynchronous gray counter to operate in different modes to perform various functions associated with a high-performance phase-locked loop (PLL). In a first mode, the asynchronous gray counter serves as a frequency detector to count oscillator cycles within a reference clock cycle. In a second mode, the asynchronous gray counter serves as a coarse phase detector to detect a phase error between a feedback clock and a reference clock. In a third mode, the asynchronous gray counter serves as a multi-modulus divider to divide an oscillator clock down to create a feedback clock. Using a single hybrid asynchronous gray counter for three separate functions reduces power consumption and area utilization.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
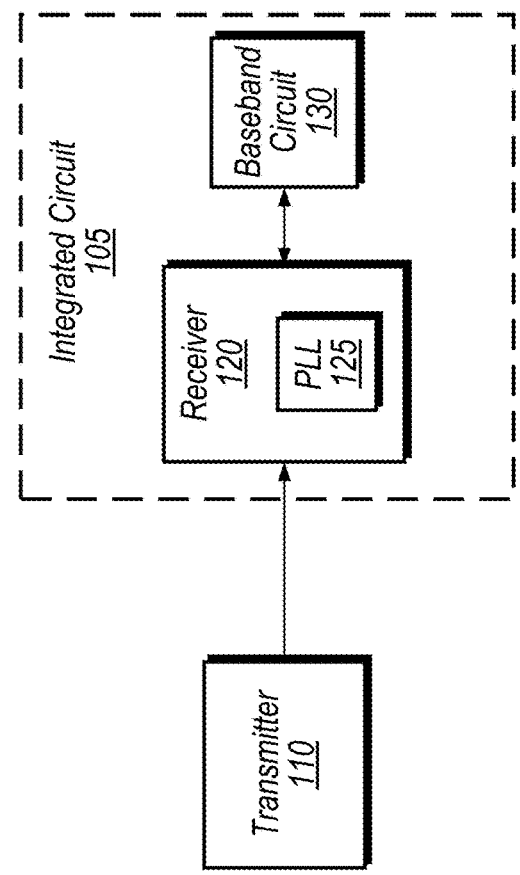
FIG. 1 is a generalized block diagram of one embodiment of a computing system.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring now to FIG. 1, a block diagram of one embodiment of a computing system 100 is shown. In one embodiment, computing system 100 includes at least integrated circuit (IC) 105 and transmitter 110. In one embodiment, transmitter 110 is on an IC which is separate from IC 105. Computing system 100 may also include any number of other components in addition to those shown. In one embodiment, IC 105 includes at least receiver 120, baseband circuit 130, and any number of other components. In one embodiment, transmitter 110 and receiver 120 are part of a serializer/deserializer (SerDes). In other embodiments, transmitter 110 and receiver 120 are part of other types of communication systems.

Transmitter 110 sends data to receiver 120 over any type of wired or wireless communication medium. Receiver 120 includes phased-locked loop (PLL) 125 to lock onto the received data signal so as to extract the data. Once receiver 120 extracts the data from the received signal, the data is provided to baseband circuit 130 for additional processing and/or storage. In one embodiment, PLL 125 includes a hybrid asynchronous gray counter with a non-gray zone detector to operate in a power-efficient manner while taking up a relatively small area as compared with traditional PLL implementations. More details regarding the hybrid asynchronous gray counter with the non-gray zone detector will be provided throughout the remainder of this disclosure.

Figure 2:
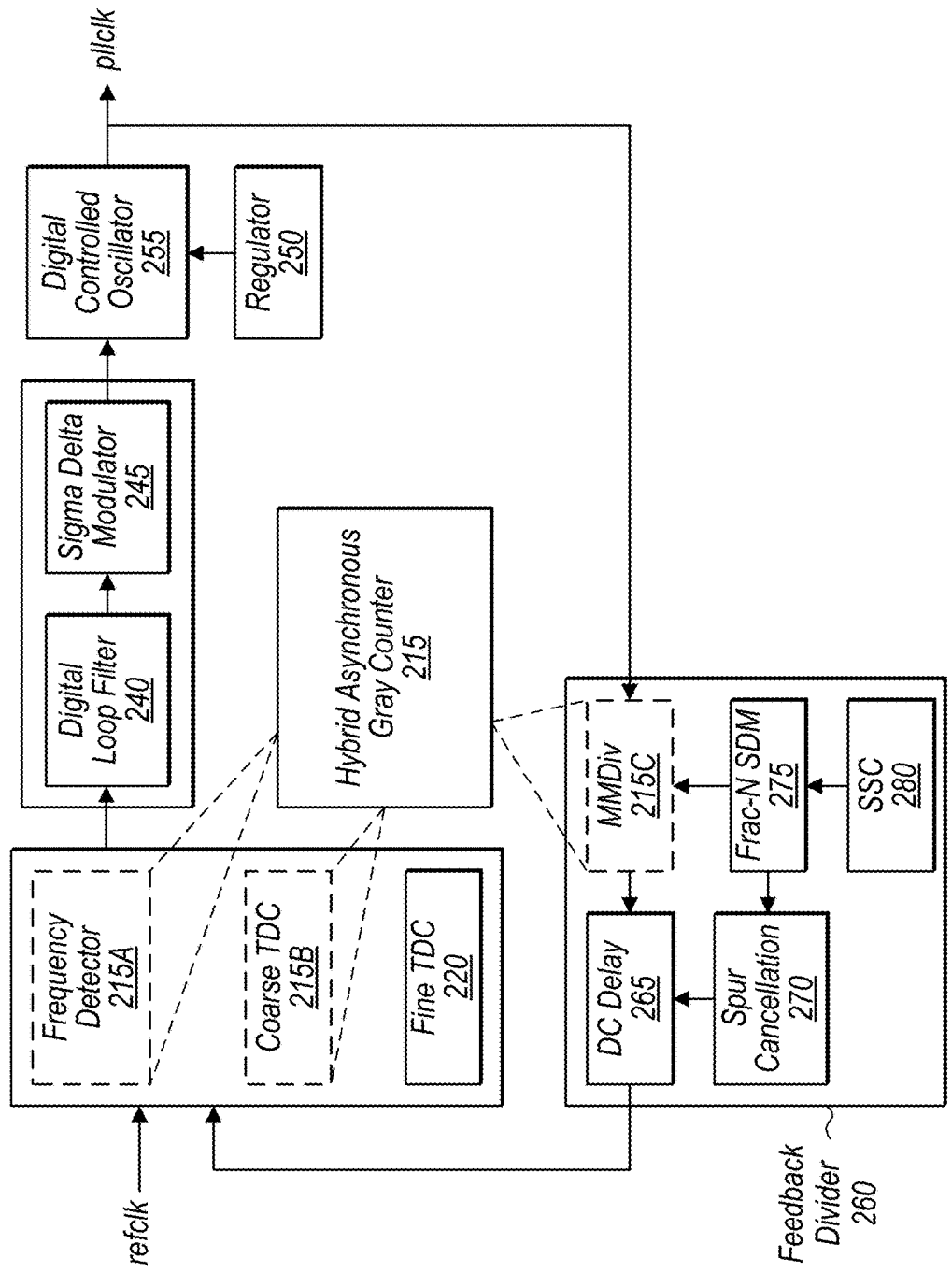
FIG. 2 is a generalized block diagram illustrating one embodiment of a PLL with a hybrid asynchronous gray counter.

Turning now to FIG. 2, a block diagram of one embodiment of a PLL 200 with a hybrid asynchronous gray counter 215 is shown. In one embodiment, hybrid asynchronous gray counter 215 performs three functions in PLL 200. In one embodiment, hybrid asynchronous gray counter 215 is time multiplexed between the three different functions which are frequency detector 215A, coarse time to digital converter (TDC) 215B, and multi-modulus divider (MMDiv) 215C. In other words, at various times during operation of PLL 200, hybrid asynchronous gray counter 215 is scheduled to operate as frequency detector 215A for a first set of intervals, as coarse time to digital converter (TDC) 215B for second set of intervals, and as multi-modulus divider 215C for a third set of intervals. It is noted that coarse TDC 215B may also be referred to herein as a coarse phase error detector, and MMDiv 215C may also be referred to herein as a frequency divider. By using a single hybrid asynchronous gray counter 215 to perform multiple functions, the power consumption and area required for implementing PLL 200 are reduced. This is contrasted with a typical prior art PLL which would have three separate hardware units to perform the functions of frequency detection, coarse phase error detection, and feedback clock generation.

In one embodiment, hybrid asynchronous gray counter 215 is dynamically configured to be in up or down circular mode, up or down reload mode, or pendulum mode. Hybrid asynchronous gray counter 215 uses a gray code for the counter state machine so that only one bit changes at a time. In other words, only one bit of the count generated by hybrid asynchronous gray counter 215 changes on each clock edge. Gray code counters are used to help mitigate the harmful effects of metastability. Hybrid asynchronous gray counter 215 when configured in re-loadable mode is also combined with a non-gray zone detector to support the functions of coarse phase error detection and feedback clock generation simultaneously. As used herein, the term "non-gray zone" is defined as when the rising edge of the reference clock is located within one cycle to the right or one cycle to the left of the rising edge of the feedback clock. The term "gray zone" is defined as when the rising edge of the reference clock is not within one cycle to the right or one cycle to the left of the rising edge of the feedback clock.

PLL 200 goes through different operating modes during the course of operation. These operating modes include a frequency acquisition mode, a phase locking mode, and a fractional-N mode. During the frequency acquisition mode, PLL 200 detects the oscillation frequency and adjusts digital controlled oscillator 255, coupled to regulator 250, accordingly. During the phase locking mode, PLL 200 divides the oscillation clock down to the feedback clock, detects the phase error between the feedback clock and the reference clock, digital loop filter 240 filters the phase error, and sigma delta modulator 245 sigma-delta modulates the filtered phase error to achieve higher digital controlled oscillator resolution. During the fractional-N mode, PLL 200 uses fractional-N sigma delta modulator (SDM) 275 to modulate the feedback clock when the feedback clock generated by feedback divider 260 has a fractional frequency. Feedback divider 260 also includes digitally controlled (DC) delay unit 265 for adding incremental delays to the feedback clock and spur cancellation unit 270 and spread-spectrum clock (SSC) 280 for cancelling spurs when the feedback clock has a fractional frequency.

During the frequency acquisition mode, hybrid asynchronous gray counter 215 serves as frequency detector 215A by counting oscillator clock cycles with a reference clock cycle. During the phase locking mode, hybrid asynchronous gray counter 215 serves as MMDiv 215C of feedback divider 260 by triggering feedback clock edges at a pre-determined count. Also during the phase locking mode, hybrid asynchronous gray counter 215 serves as coarse TDC 215B by having the reference clock sample the feedback count so as to calculate the coarse phase error. Hybrid asynchronous gray counter 215 performs various functions which contribute to digital filter clock generation, digital controlled oscillator sigma delta modulator clock generation, fractional-N sigma delta modulator clock generation, and feedback clock early signal generation. These functions are performed as part of multi-phase clock generation so as to trigger multi-phase clock edges at pre-determined feedback counter values.

Figure 3:
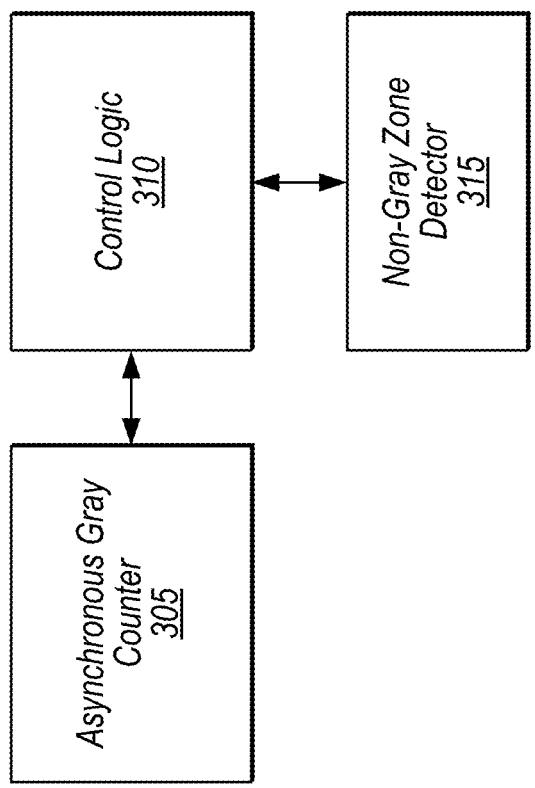
FIG. 3 is a generalized block diagram illustrating one embodiment of a hybrid asynchronous gray counter capable of performing multiple functions.

Referring now to FIG. 3, a block diagram of one embodiment of a hybrid asynchronous gray counter 300 capable of performing multiple functions is shown. In one embodiment, hybrid asynchronous gray counter 300 includes asynchronous gray counter 305, control logic 310, and non-gray zone detector 315. In one embodiment, asynchronous gray counter 305 includes the circuitry of asynchronous gray counter 400 (of FIG. 4). In one embodiment, non-gray zone detector 315 includes the circuitry of non-gray zone detector 500 (of FIG. 5). Control logic 310 includes circuitry for time-sharing asynchronous gray counter 305 between different modes for implementing a frequency detector, coarse phase detector, and frequency divider. This allows hybrid asynchronous gray counter 300 to perform multiple different functions within a high performance phase-locked loop (PLL). As part of performing these multiple different functions, asynchronous gray counter 305 is able to operate as either a circular counter, pendulum counter, or reloadable counter.

Figure 4:
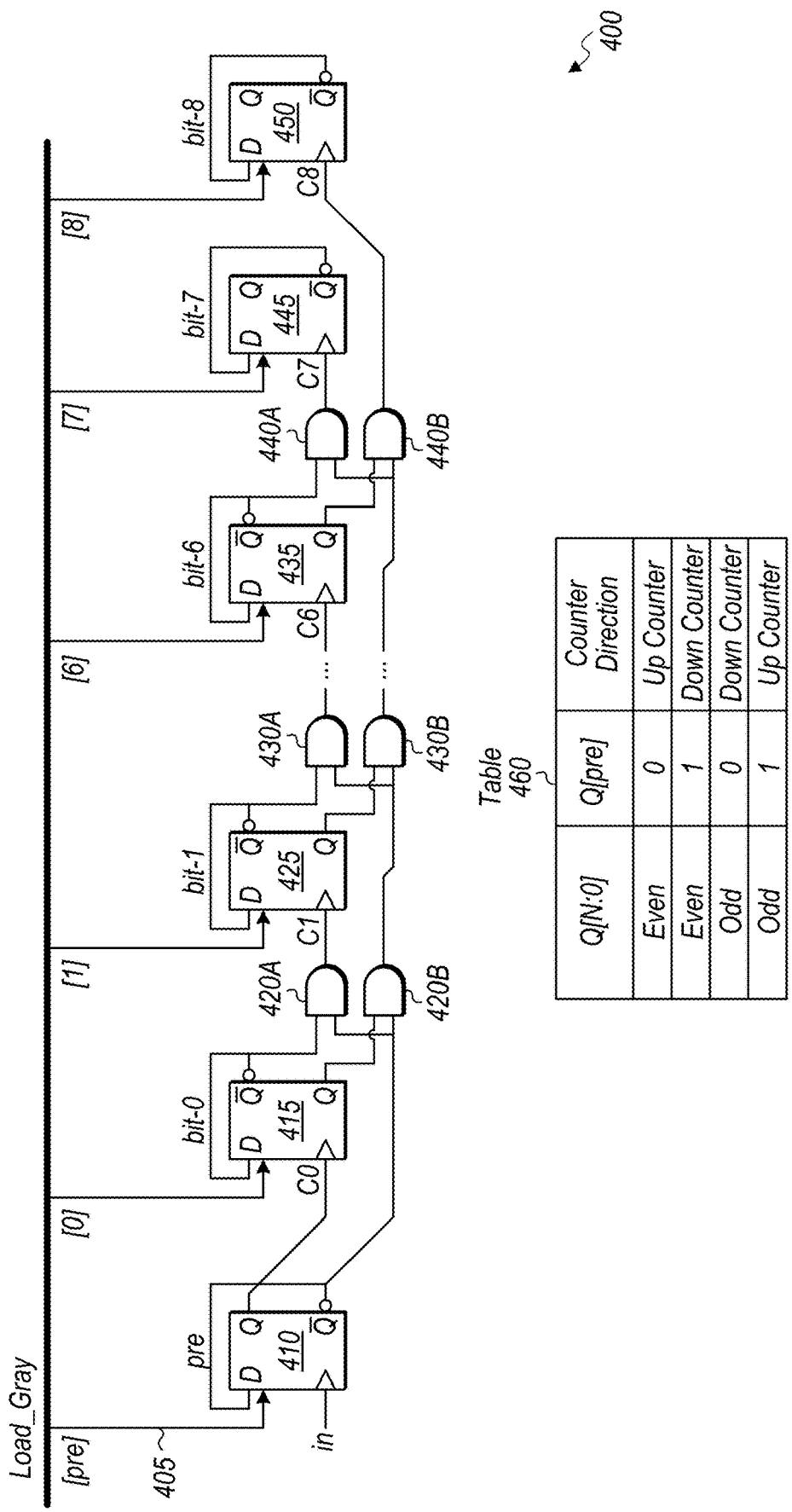
FIG. 4 is a generalized block diagram illustrating one embodiment of an asynchronous gray counter.

Turning now to FIG. 4, a block diagram of one embodiment of an asynchronous gray counter 400 is shown. Each stage of asynchronous gray counter 400 is a toggling flip-flop whose clock signal is generated by a previous stage. These clock signals are labeled as C0, C1, and up to C8. In one embodiment, asynchronous gray counter 400 includes a pre-counter flop 410 coupled to bit-0 flop 415 which is in turn coupled to bit-1 flop 425 with the connections continuing on through the final three flops 435, 445, and 450 for bits 6, 7, and 8, respectively. The inverted Q output of flop 410 and the outputs of flop 415 are coupled to a pair of AND-gates 420A-B, the output of AND-gate 420B and the outputs of flop 425 are coupled to a pair of AND-gates 430A-B, and the outputs of flop 435 and the output of the previous stage's AND-gate (not shown) are coupled to a pair of AND-gates 440A-B. The other flops which are not shown are also coupled to a corresponding pair of AND-gates in the same manner as shown for flops 415, 425, and 435. While asynchronous gray counter 400 is shown as being a 9-bit counter it should be understood that this is merely indicative of one embodiment. In other embodiments, asynchronous gray counter 400 may include other numbers of flip-flops to implement counters with other numbers of bits besides nine.

In one embodiment, asynchronous gray counter 400 operates as an up-down pendulum counter to alternate between counting up and counting down. In this embodiment, asynchronous gray counter 400 counts up from 0 to N/2. To switch into the down-counting mode, the polarity of input 405 provided to the pre-counter flop 410 is flipped as shown in counter direction truth table 460. Then, asynchronous gray counter 400 counts down from N/2 to 0. When asynchronous gray counter 400 reaches 0, the polarity of input 405 provided to the pre-counter flop 410 is again flipped to cause asynchronous gray counter 400 to start counting up. This process can repeat for as long as asynchronous gray counter 400 is in the pendulum counter mode.

In another embodiment, asynchronous gray counter 400 is a reloadable up-down counter. In this embodiment, asynchronous gray counter 400 is loaded with a value via the load_gray inputs shown at the top of the figure. When loading values to flops 415-450, the value written to pre-counter flop 410 determines the count direction of counter 400.

Figure 5:
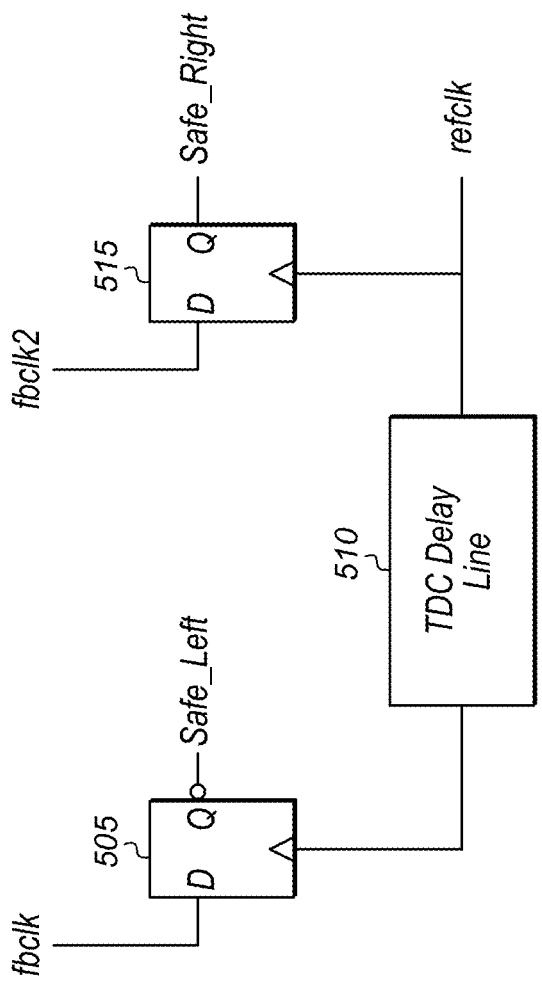
FIG. 5 is a generalized block diagram illustrating one embodiment of a non-gray zone detector.

Referring now to FIG. 5, a block diagram of one embodiment of a non-gray zone detector 500 is shown. In one embodiment, non-gray zone detector 500 includes flip-flops 505 and 515 and time to digital converter (TDC) delay line 510. A non-delayed version of the feedback clock (fbclk) is the input to flip-flop 505 and the feedback clock delayed by two unit intervals (fbclk2) is coupled as the input to flip-flop 515. The output of flip-flop 505 is inverted and is a safe_left signal while the output of flip-flop 515 is not inverted and is a safe_right signal. The safe_left signal toggles when the left boundary of the gray zone has been reached. The safe_right signal toggles when the right boundary of the non-gray zone has been reached. The reference clock (refclk) is coupled to the clock input to flip-flop 515. The reference clock is also delayed by TDC delay line 510, and this delayed version of the reference clock is coupled to the clock input of flip-flop 505.

Figure 6:
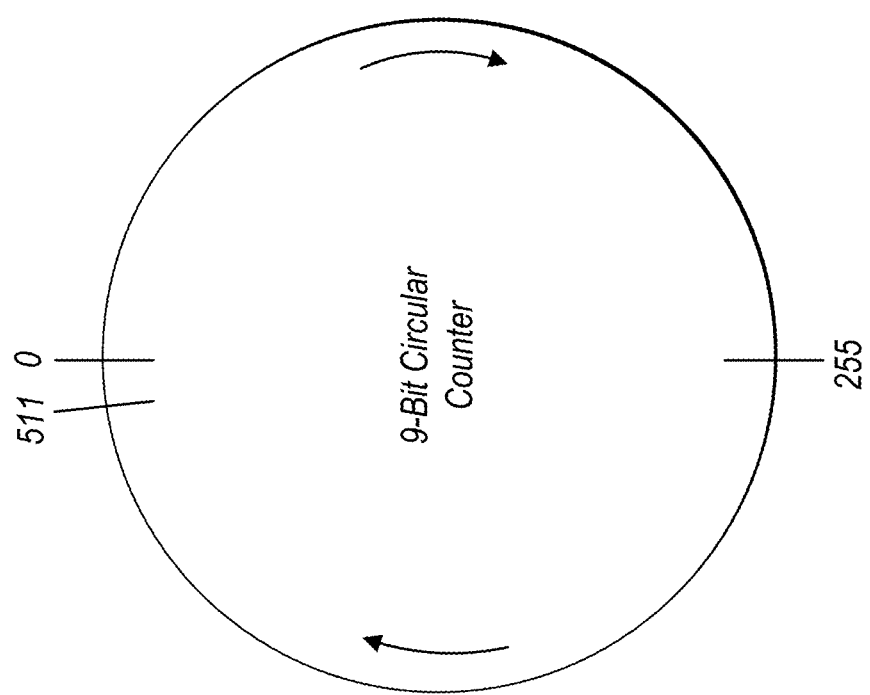
FIG. 6 is a diagram representing the operation of a circular counter in accordance with one embodiment.

Turning now to FIG. 6, a diagram 600 representing the operation of a circular counter is shown. In one embodiment, control logic (e.g., control logic 310 of FIG. 3) programs an asynchronous gray counter to operate as a circular gray up counter for at least a portion of time while the PLL (e.g., PLL 200 of FIG. 2) is in frequency acquisition mode. In one embodiment, a circular gray counter is used as a frequency detector (e.g., frequency detector 215A) within a PLL to count the number of oscillator clock cycles within a reference clock cycle, with the oscillator clock and reference clock asynchronous with respect to each other. A representation of the operation of a 9-bit circular gray up counter is shown in diagram 600. Circular gray up counter counts up from 0 to 511 and then wraps around from 511 to 0. The circular gray up counter counts up from 0 after wrapping around from 511 and then repeats this process for as long as the asynchronous gray counter remains in circular gray up counter mode. In other embodiments, the circular gray counter can have other numbers of bits besides 9. For a circular gray counter, the frequency can be derived from Count[n]−Count[n−1], with special handling to deal with Count[n] marching across 0.

In one embodiment, an asynchronous gray counter programmed to operate as a circular up counter increments the count in response to detecting an edge of the oscillator clock. The edge may be the rising edge or falling edge of the oscillator clock. A first count value of the circular counter is sampled on a reference clock edge. Then, a second count value of the circular counter is sampled on the next reference clock edge. Then, the first count value is subtracted from the second count value to derive the frequency of the reference clock. This process may be repeated any number of times until the frequency error between the reference clock and the feedback clock is below a threshold.

Figure 7:
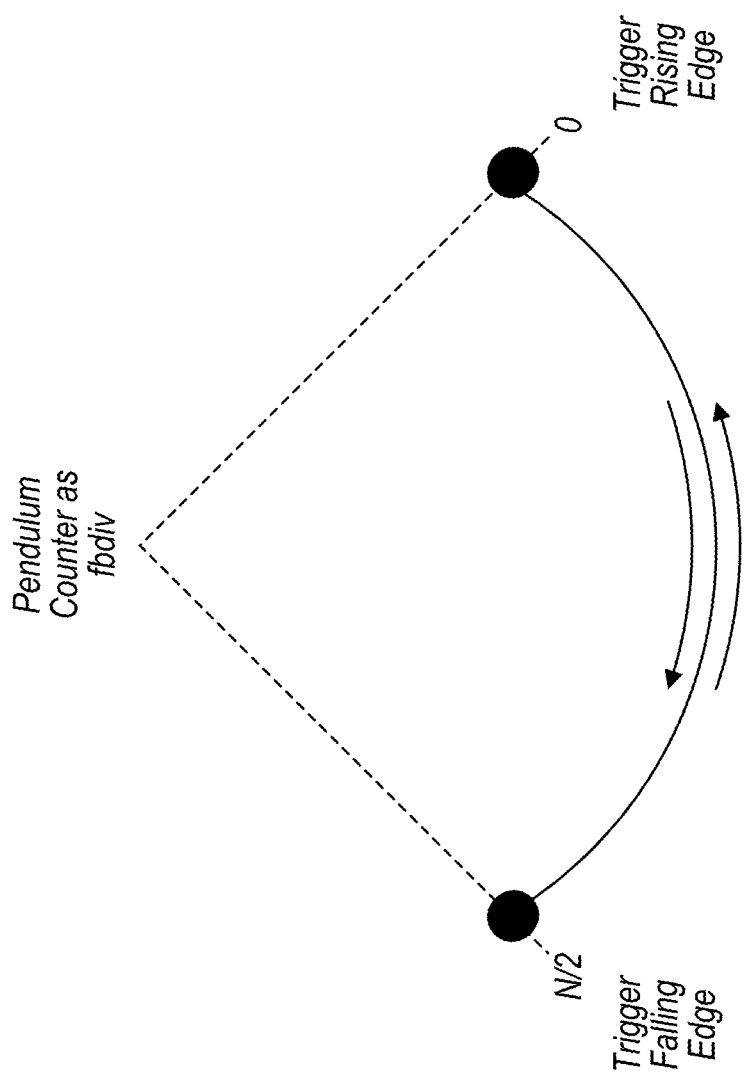
FIG. 7 is a diagram representing the operation of a pendulum counter in accordance with one embodiment.

Referring now to FIG. 7, a diagram 700 representing the operation of a pendulum counter is shown. In one embodiment, control logic (e.g., control logic 310 of FIG. 3) programs an asynchronous gray counter to operate as a pendulum counter in at least one mode. For example, in one embodiment, the asynchronous gray counter is programmed to operate as a pendulum counter so as to implement a feedback divider (e.g., frequency divider 260 of FIG. 2). In this embodiment, for even division, the pendulum counter counts up from 0 to N/2 and is triggered by the feedback clock's rising edge. The value of N is equal to the maximum value that the counter is able to reach. Then, when the pendulum counter reaches N/2, the pendulum counter reverses directions and counts down to 0 with the trigger being the feedback clock's falling edge. For odd division, the pendulum counter counts up from 0 to (N−1)/2, triggered by the feedback clock's rising edge. For odd decision, the pendulum counter stays at (N−1)/2 for one cycle, and then the pendulum counter counts down to 0, triggered by the falling edge of the feedback clock.

In another embodiment, the asynchronous gray counter is programmed to operate as a pendulum counter so as to implement a coarse phase detector (e.g., coarse TDC 215B of FIG. 2). When the asynchronous gray counter is operating as a coarse phase detector, the counter increments once every oscillator clock cycle and the reference clock is used to sample the pendulum counter. The coarse phase error amplitude is equal to the sampled count. The sign of the coarse phase error can be obtained from the time to digital converter (TDC).

Figure 8:
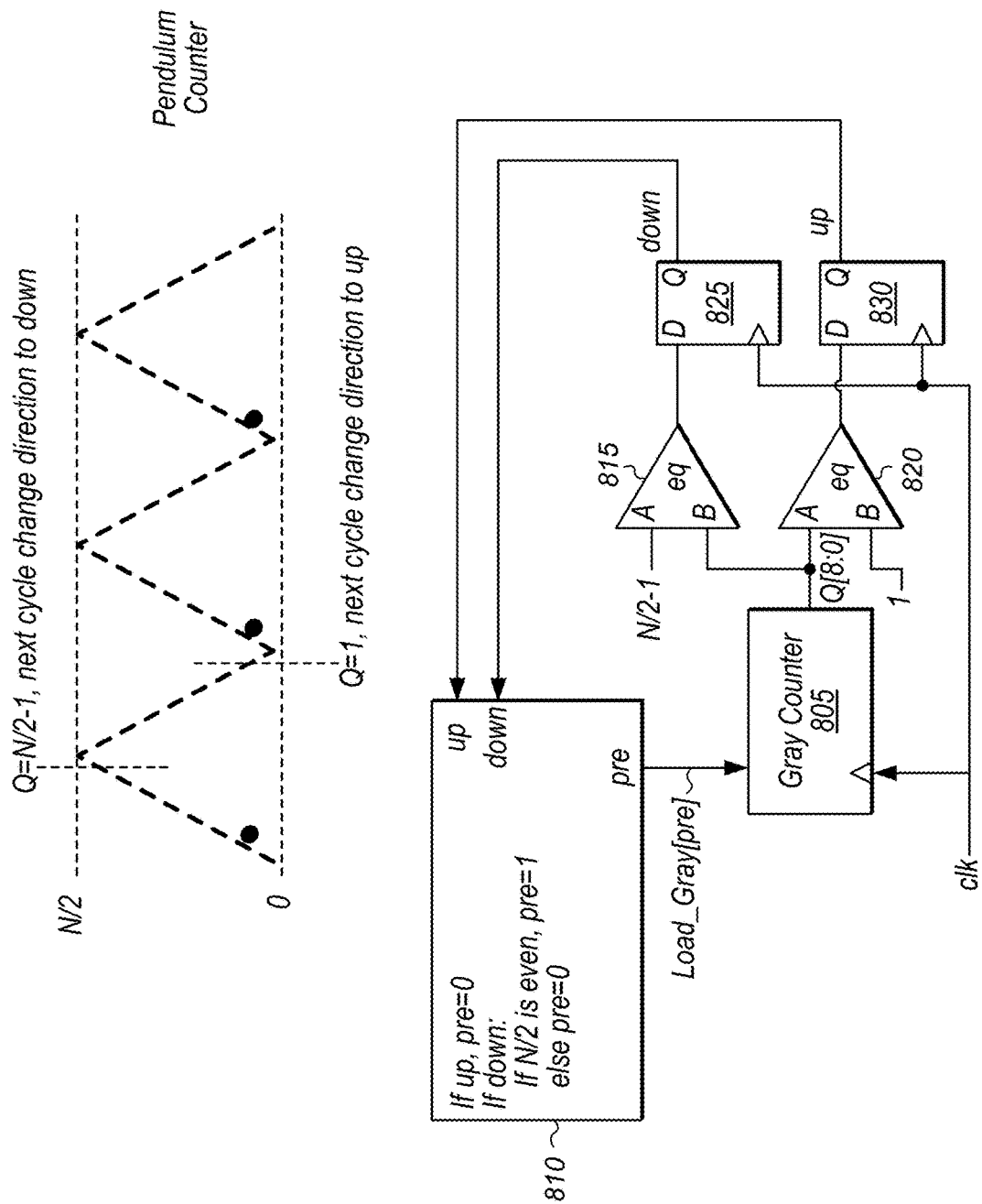
FIG. 8 is a block diagram of one embodiment of a pendulum gray counter.

Turning now to FIG. 8, a block diagram of one embodiment of a pendulum gray counter 800 is shown. In one embodiment, pendulum gray counter 800 includes gray counter 805, control logic 810, comparators 815 and 820, and flops 825 and 830. In other embodiments, pendulum gray counter 800 includes other components and/or is arranged in other suitable fashions. The diagram at the top of FIG. 8 shows how gray counter 805 will count up from 0 to N/2 and then down from N/2 to 0. This pattern will repeat once gray counter 805 reaches 0.

In one embodiment, the output of gray counter 805 is compared to N/2−1 by comparator 815 and the output of gray counter 805 is compared to 1 by comparator 820. The outputs of comparators 815 and 820 are provided to flops 825 and 830, respectively, and then the outputs of flops 825 and 830 are provided to control logic 810. Pseudo-code representing the operation of control logic 810 is shown within the corresponding box. When the up signal is asserted, control logic 810 drives the "pre" signal to 0, with the "pre" signal coupled to gray counter 805. This will cause gray counter 805 to start counting up in the subsequent clock cycle. This "pre" signal corresponds to input 405 to the pre-counter flop 410 of asynchronous gray counter 400 (of FIG. 4). The "pre" signal controls the direction that gray counter 805 counts. When the down signal is asserted, if N/2 is even, then the "pre" signal is set to 1. Otherwise, when the down signal is asserted and N/2 is odd, then the "pre" signal is set to 0. This will cause gray counter 805 to start counting down in the subsequent clock cycle.

Figure 9:
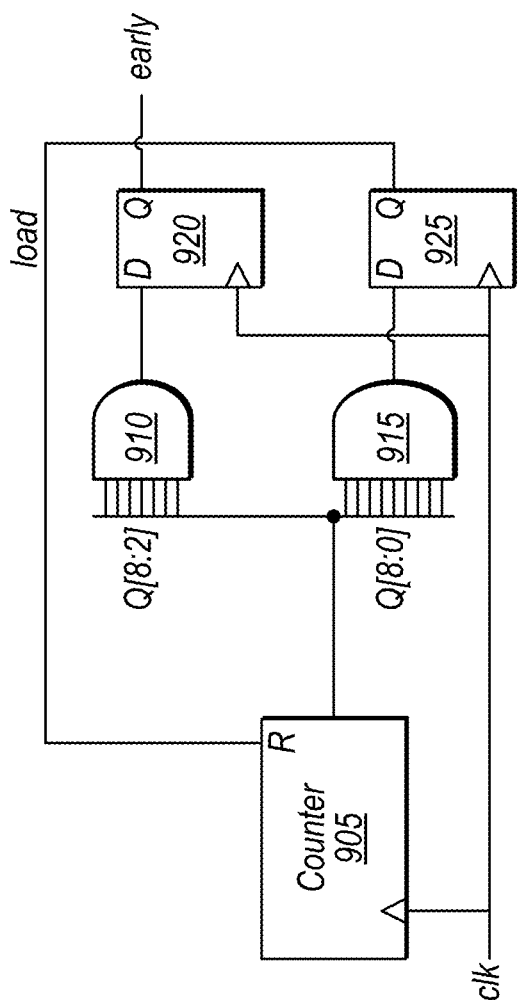
FIG. 9 is a generalized block diagram illustrating one embodiment of a feedback clock generation unit.

Referring now to FIG. 9, a block diagram of one embodiment of a feedback clock generation unit 900 is shown. In one embodiment, feedback clock generation unit 900 works in reload mode for low power applications. In one embodiment, counter 905 is an asynchronous gray counter (e.g., asynchronous gray counter 400 of FIG. 4). In reload mode, counter 905 operates as a reloadable counter. The output of counter 905 is coupled to AND gates 910 and 915. The output of AND gate 910 is coupled to flop 920, with the output of flop 920 the early signal. The output of AND gate 915 is coupled to flop 925, with the output of flop 925 coupled to counter 905 to cause counter 905 to be initialized with the reload value after which counter 905 will count down. In one embodiment, the reload value is equal to N−1, with N being the highest output value of the counter.

Figure 10:
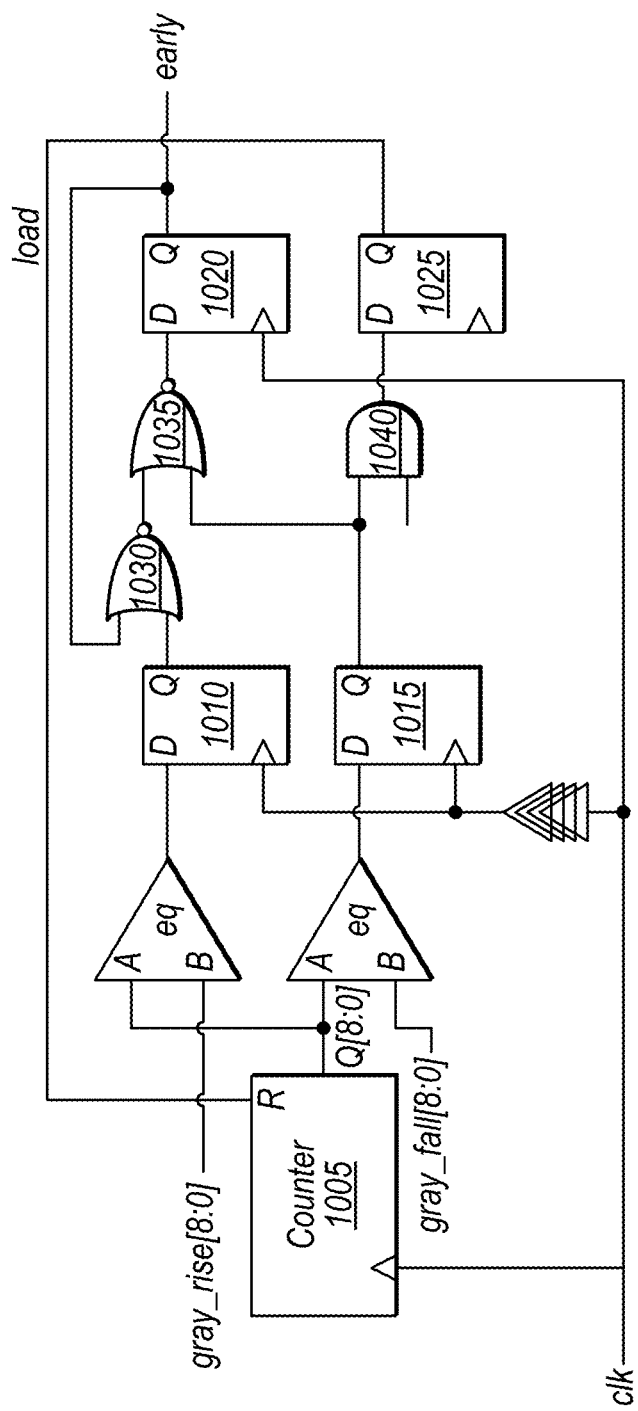
FIG. 10 is a generalized block diagram illustrating one embodiment of a non-gray zone detector.

Turning now to FIG. 10, a block diagram of one embodiment of a feedback clock generation unit 1000 is shown. Feedback clock generation unit 1000 includes counter 1005 which may be implemented using the circuitry of asynchronous gray counter 400 (of FIG. 4) in one embodiment. In one embodiment, feedback clock generation unit 1000 works in circular mode for low power applications. In this embodiment, counter 1005 operates as a circular counter. The circuitry of feedback clock generation unit 1000 is similar to feedback clock generation unit 900 (of FIG. 9) with the exception of intermediate flops 1010 and 1015 which feed the final stage of flops 1020 and 1025 via combinatorial logic gates 1030, 1035, and 1040. It should be understood that other feedback clock generation units may have other suitable arrangements of logic gates in other embodiments.

Figure 11:
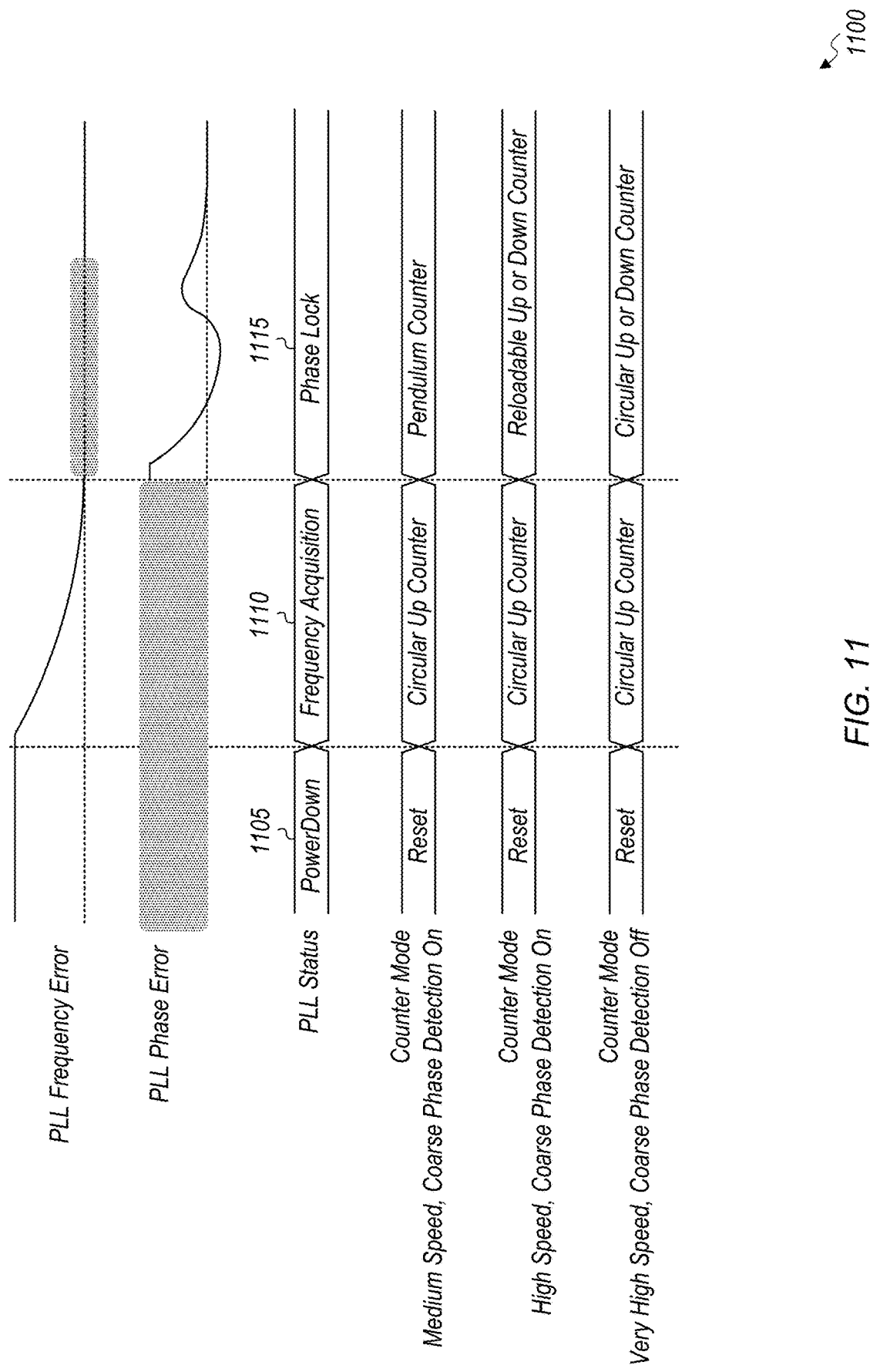
FIG. 11 is a diagram of the different counter modes used depending on PLL status in accordance with one embodiment.

Turning now to FIG. 11, a diagram 1100 of the different counter modes used depending on PLL status in accordance with one embodiment is shown. In one embodiment, a hybrid asynchronous gray counter (e.g., hybrid asynchronous gray counter 300 of FIG. 3) operates in different modes depending on the status of the PLL. For example, while the PLL is in power down mode 1105, the counter is in reset mode for all three different counter implementations shown at the bottom of diagram 1100. These different counter implementations are for a medium speed PLL frequency, high speed PLL frequency, and very high speed PLL frequency. The thresholds for determining whether a PLL frequency is medium, high, or very high may vary according to the embodiment.

In one embodiment, when the PLL is in frequency acquisition mode 1110, then the counter is programmed to operate in circular up counter mode. Then, once the PLL frequency error has fallen below a threshold, the PLL will transition to phase lock mode 1115. The counter will operate in different modes while the PLL is in phase lock mode 1115 depending on the type of counter implementation. For example, in one embodiment, if the counter is being implemented for a medium speed PLL frequency, then the counter will operate as a pendulum counter while the PLL is in phase lock mode 1115. If the counter is being implemented for a high speed PLL frequency, then the counter will operate as a reloadable up or down counter while the PLL is in phase lock mode 1115. Otherwise, if the counter is being implemented for a very high speed PLL frequency, then the counter will operate as a circular up or down counter with the coarse phase detector turned off while the PLL is in phase lock mode 1115.

Figure 12:
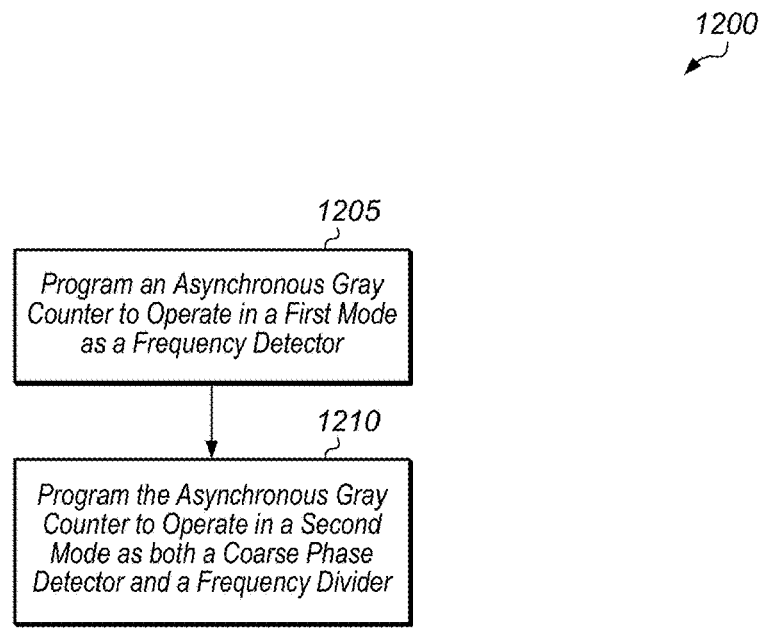
FIG. 12 is a flow diagram of one embodiment of a method for time-sharing an asynchronous gray counter between a plurality of different modes.

Turning now to FIG. 12, one embodiment of a method 1200 for time-sharing an asynchronous gray counter between a plurality of different modes is shown. For purposes of discussion, the steps in this embodiment (as well as for FIG. 13) are shown in sequential order. However, in other embodiments some steps may occur in a different order than shown, some steps may be performed concurrently, some steps may be combined with other steps, and some steps may be absent.

Control logic (e.g., control logic 310 of FIG. 3) programs an asynchronous gray counter (e.g., asynchronous gray counter 305 of FIG. 3) to operate in a first mode as a frequency detector (block 1205). Also, the control logic programs the asynchronous gray counter to operate in a second mode as both a coarse phase detector and a frequency divider (block 1210). After block 1210, method 1200 ends.

The control logic uses any suitable algorithm and/or state machine logic to determine when to switch between the different modes. By using a single asynchronous gray counter to perform multiple different functions, the area required for implementing the asynchronous gray counter is reduced. Also, the power consumption of the asynchronous gray counter is reduced since only a single asynchronous gray counter is used to perform multiple functions simultaneously. This time-sharing and simultaneous multi-function capability of the single asynchronous gray counter may be implemented in various applications that rely on high performance PLLs. Other uses of the asynchronous gray counter capable of performing multiple different functions are possible and are contemplated.

Figure 13:
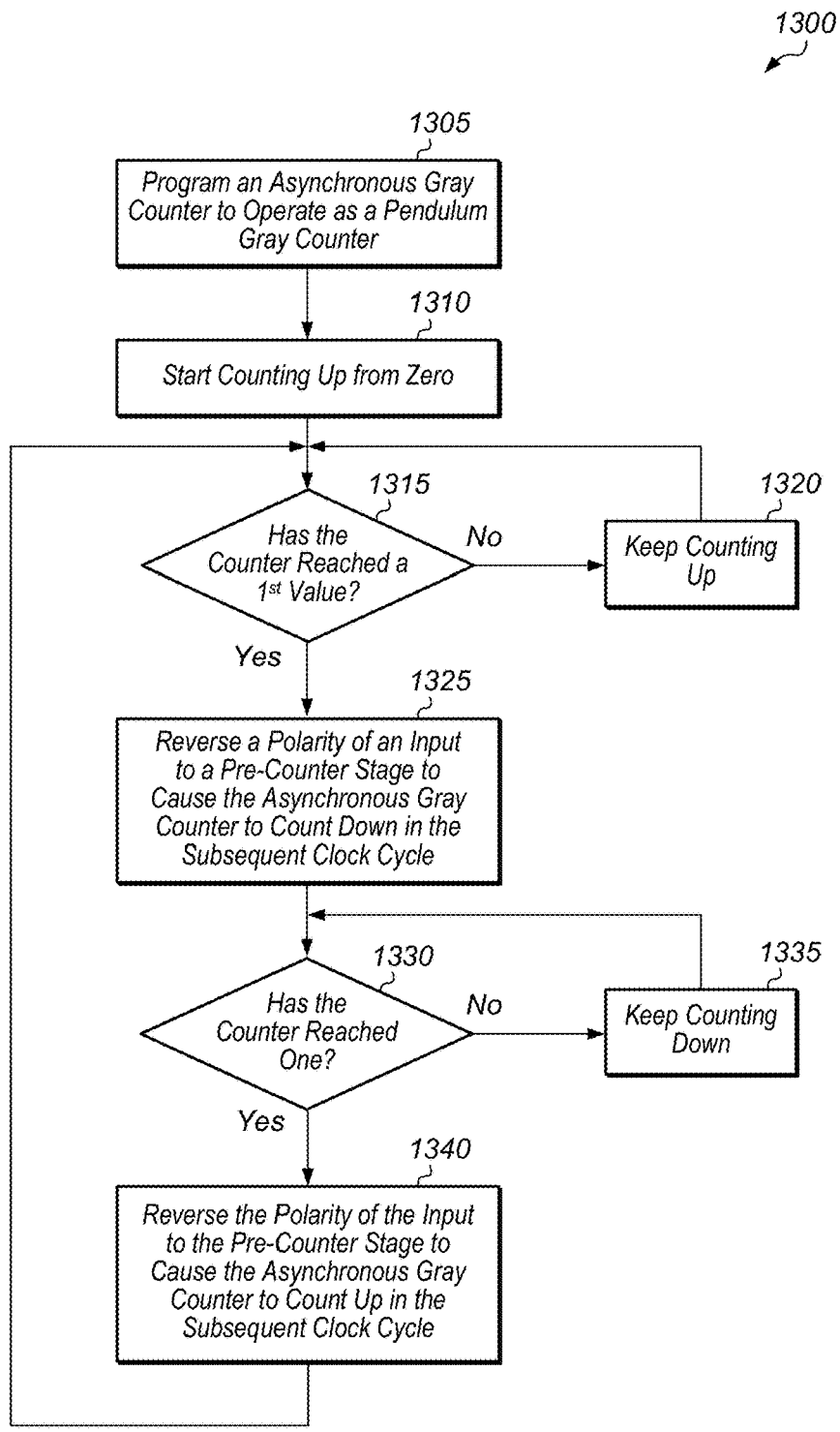
FIG. 13 is a flow diagram of one embodiment of a method for operating an asynchronous gray counter as a pendulum gray counter.

Referring now to FIG. 13, one embodiment of a method 1300 for operating an asynchronous gray counter as a pendulum gray counter is shown. Control logic programs an asynchronous gray counter to operate as a pendulum gray counter (block 1305). At the beginning of operation as a pendulum gray counter, the asynchronous gray counter starts counting up from zero (block 1310). If the asynchronous gray counter has not yet reached a first value (conditional block 1315, "no" leg), the asynchronous gray counter keeps counting up (block 1320). When the asynchronous gray counter reaches the first value (conditional block 1315, "yes" leg), then the control logic reverses a polarity of an input to a pre-counter stage to cause the asynchronous gray counter to count down in the subsequent clock cycle (block 1325). In one embodiment, the first value is N/2−1, where N is the highest value the counter can reach. It is assumed for the purposes of this discussion that N is an integer.

After block 1325, the asynchronous gray counter keeps counting down (block 1335) as long as the counter has not reached one (conditional block 1330, "no" leg). When the hybrid asynchronous gray counter reaches one (conditional block 1330, "yes" leg), the control logic reverses the polarity of the input to the pre-counter stage to cause the hybrid asynchronous gray counter to count up in the subsequent clock cycle (block 1340). After block 1340, method 1300 returns to conditional block 1315. It is noted that method 1300 can continue until the control logic programs the hybrid asynchronous gray counter to operate as a different type of counter.

Figure 14:
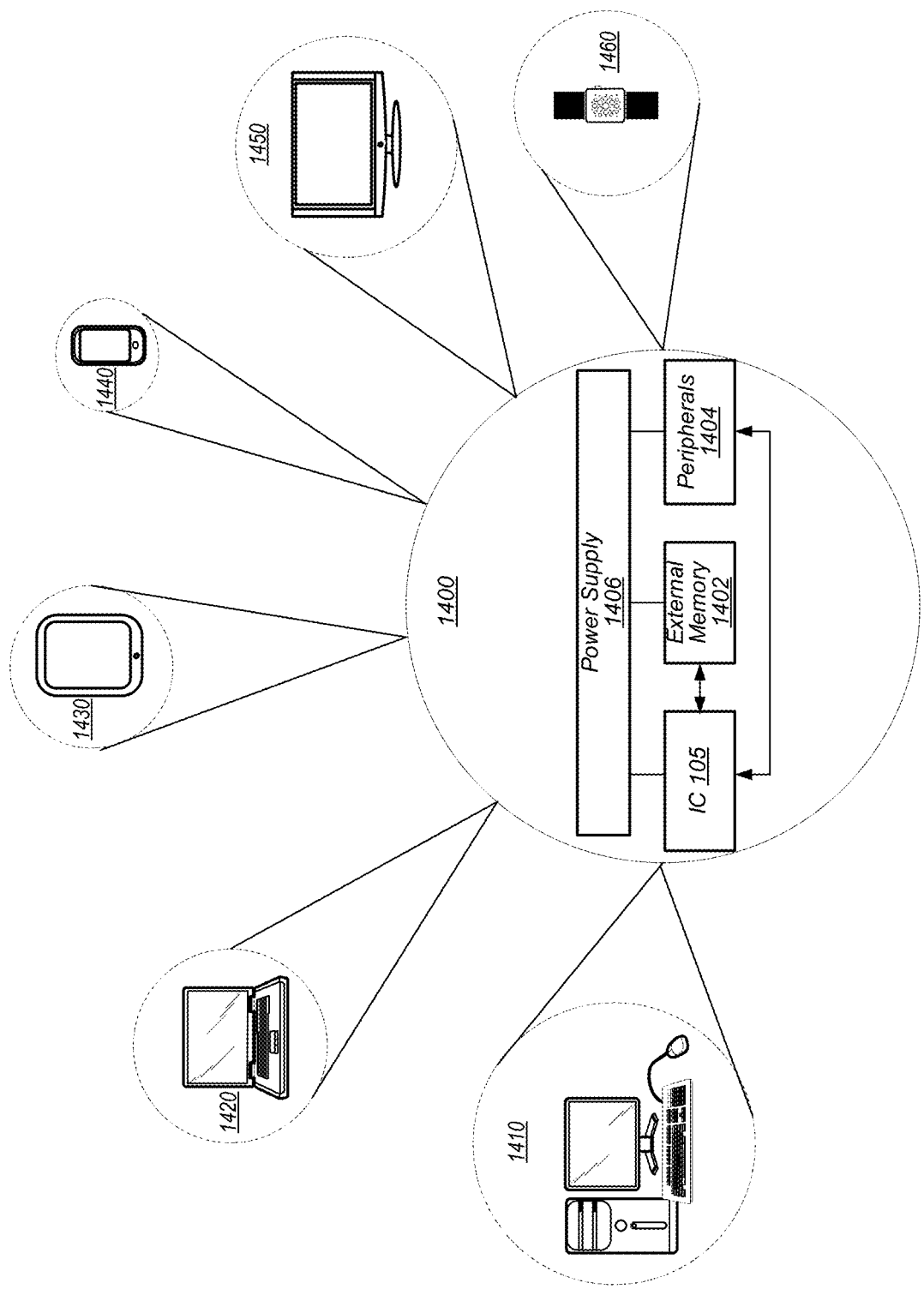
FIG. 14 is a block diagram of one embodiment of a system.

Turning now to FIG. 14, a block diagram of one embodiment of a system 1400 is shown. As shown, system 1400 may represent chip, circuitry, components, etc., of a desktop computer 1410, laptop computer 1420, tablet computer 1430, cell or mobile phone 1440, television 1450 (or set top box configured to be coupled to a television), wrist watch or other wearable item 1460, or otherwise. Other devices are possible and are contemplated. In the illustrated embodiment, the system 1400 includes at least one instance of IC 105 (of FIG. 1) coupled to an external memory 1402. In various embodiments, IC 105 may be included within a system on chip (SoC) or integrated circuit (IC) which is coupled to external memory 1402, peripherals 1404, and power supply 1406.

IC 105 is coupled to one or more peripherals 1404 and the external memory 1402. A power supply 1406 is also provided which supplies the supply voltages to IC 105 as well as one or more supply voltages to the memory 1402 and/or the peripherals 1404. In various embodiments, power supply 1406 may represent a battery (e.g., a rechargeable battery in a smart phone, laptop or tablet computer). In some embodiments, more than one instance of IC 105 may be included (and more than one external memory 1402 may be included as well).

The memory 1402 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 105 in a chip-on-chip configuration, a package-on-package configuration, or a multi-chip module configuration.

The peripherals 1404 may include any desired circuitry, depending on the type of system 1400. For example, in one embodiment, peripherals 1404 may include devices for various types of wireless communication, such as wifi, Bluetooth, cellular, global positioning system, etc. The peripherals 1404 may also include additional storage, including RAM storage, solid state storage, or disk storage. The peripherals 1404 may include user interface devices such as a display screen, including touch display screens or multitouch display screens, keyboard or other input devices, microphones, speakers, etc.

Figure 15:
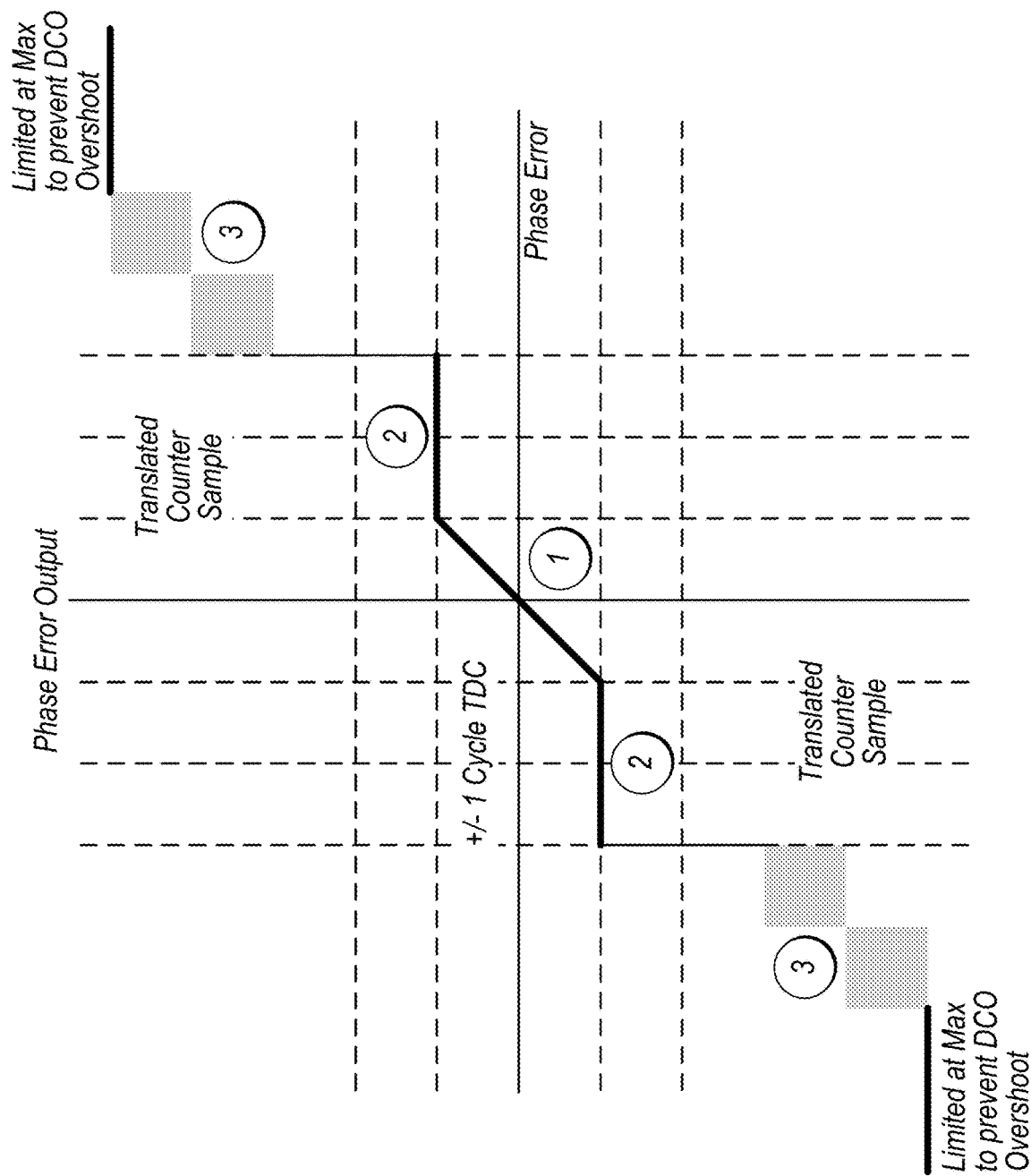
FIG. 15 is a diagram of one embodiment of achieving a reliable coarse phase detector function with a non-gray zone detector.

Referring now to FIG. 15, a diagram of one embodiment of achieving a reliable coarse phase detector function with a non-gray zone detector is shown. When a non-gray zone is detected, the coarse phase detector reading will not be used. Instead, the fine TDC reading is used. When the coarse phase detector reads between −margin and +margin (for example, from −3 to +3), −1 or +1 is used as the coarse phase error. This is to ensure monotonicity when transitioning from the fine TDC to the coarse phase detector. When the coarse phase detector reads outside of −margin and +margin, but inside −limit and +limit, the exact coarse phase detector readout is used. When the coarse phase detector reads outside of −limit and +limit, −limit or +limit is used. This is to prevent excessive digitally controlled oscillator (DCO) frequency overshoot.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
    an asynchronous gray counter comprising a plurality of flip-flops; and
    control logic coupled to the asynchronous gray counter, wherein the control logic is configured to:
        program the plurality of flip-flops to implement a circular gray up counter when the asynchronous gray counter is operating in a first mode; and
        program the plurality of flip-flops to implement a pendulum gray counter when the asynchronous gray counter is operating in a second mode.

2. The circuit as recited in claim 1, wherein the control logic is further configured to program the plurality of flip-flops to implement a pendulum gray counter when the asynchronous gray counter is operating in a third mode as a frequency divider to divide a frequency of an oscillator clock by a given value to generate a feedback clock.

3. The circuit as recited in claim 2, wherein in the third mode, the asynchronous gray counter is triggered by a rising edge of the feedback clock when counting up, and the asynchronous gray counter is triggered by a falling edge of the feedback clock when counting down.

4. The circuit as recited in claim 3, wherein the asynchronous gray counter waits one cycle before transitioning from counting up to counting down when dividing by an odd integer.

5. The circuit as recited in claim 1, wherein when implementing the pendulum gray counter, the asynchronous gray counter is configured to alternate between counting up and counting down.

6. The circuit as recited in claim 5, wherein when the asynchronous gray counter reaches a first value after counting up, the control logic is configured to reverse a polarity of an input to a pre-counter stage to cause the asynchronous gray counter to count down.

7. The circuit as recited in claim 1, further comprising a non-gray zone detector, wherein the non-gray zone detector comprises a pair of flip-flops with a clock signal coupled to a delay element in between the pair of flip-flops.

8. A method comprising:
programming, by control logic, a plurality of flip-flops of an asynchronous gray counter to implement a circular gray up counter when the asynchronous gray counter is operating in a first mode; and
programming the plurality of flip-flops to implement a pendulum gray counter when the asynchronous gray counter is operating in a second mode.

9. The method as recited in claim 8, further comprising programming the plurality of flip-flops to implement a pendulum gray counter when the asynchronous gray counter is operating in a third mode as a frequency divider to divide a frequency of an oscillator clock by a given value to generate a feedback clock.

10. The method as recited in claim 9, wherein in the third mode, the asynchronous gray counter is triggered by a rising edge of the feedback clock when counting up, and the asynchronous gray counter is triggered by a falling edge of the feedback clock when counting down.

11. The method as recited in claim 10, further comprising waiting, by the asynchronous gray counter, one cycle before transitioning from counting up to counting down when dividing by an odd integer.

12. The method as recited in claim 8, further comprising alternating between counting up and counting down while operating in the second mode.

13. The method as recited in claim 12, wherein when the asynchronous gray counter reaches a first value after counting up, the method further comprising reversing a polarity of an input to a pre-counter stage to cause the asynchronous gray counter to count down.

14. The method as recited in claim 8, further comprising non-implementing a non-gray zone detector comprising a pair of flip-flops with a clock signal coupled to a delay element in between the pair of flip-flops.

15. A system comprising:
a memory; and
a hybrid asynchronous gray counter coupled to the memory and configured to:
operate in a first mode as a frequency detector to count a number of cycles of an oscillator clock within a cycle of a reference clock; and
operate in a second mode as a coarse phase detector to calculate a coarse phase error between the reference clock and a feedback clock, wherein the coarse phase error is calculated by sampling the hybrid asynchronous gray counter with the reference clock.

16. The system as recited in claim 15, wherein the hybrid asynchronous gray counter is further configured to operate in a third mode as a frequency divider to divide a frequency of the oscillator clock by a given value to generate the feedback clock.

17. The system as recited in claim 16, wherein in the third mode, the hybrid asynchronous gray counter is triggered by a rising edge of the feedback clock when counting up, and the hybrid asynchronous gray counter is triggered by a falling edge of the feedback clock when counting down.

18. The system as recited in claim 17, wherein the hybrid asynchronous gray counter waits one cycle before transitioning from counting up to counting down when dividing by an odd integer.

19. The system as recited in claim 15, wherein when implementing a pendulum gray counter, the hybrid asynchronous gray counter is configured to alternate between counting up and counting down.

20. The system as recited in claim 19, wherein when the hybrid asynchronous gray counter reaches a first value after counting up, a polarity of an input to a pre-counter stage is reversed to cause the hybrid asynchronous gray counter to count down.

* * * * *